United States Patent [19]

Zibis

[11] Patent Number: 4,684,907
[45] Date of Patent: Aug. 4, 1987

[54] ELECTRICAL FILTER WITH ACOUSTIC WAVES

[75] Inventor: Peter Zibis, Munich, Fed. Rep. of Germany

[73] Assignee: Siemens Aktiengesellschaft, Berlin and Munich, Fed. Rep. of Germany

[21] Appl. No.: 865,430

[22] Filed: May 21, 1986

[30] Foreign Application Priority Data

Jun. 3, 1985 [DE] Fed. Rep. of Germany ....... 3519853

[51] Int. Cl.$^4$ ...................... H03H 9/72; H03H 9/145
[52] U.S. Cl. ................................ 333/196; 310/313 C; 333/195; 29/25.35
[58] Field of Search ................................ 333/150–155, 333/193–196; 310/313 R, 313 A, 313 B, 313 C, 313 D; 29/25, 35

[56] References Cited

PUBLICATIONS

IEEE Transactions on Sonics and Ultrasonics, Mar., 1975, "Simplifications for the Analysis of Interdigital Surface-Wave Devices", by George L. Matthaei et al., pp. 105–114.

Siemens Forsch–u. Entwickl–Ber., vol. 6 (1977), No. 3, "Speeding Up the Analysis of Surface Acoustic Wave Devices", by A. Gunter et al., pp. 132–136.

"Principles of Surface Wave Filter Design"–Herbert Matthews Wiley, 1977, Surface Wave Filters Design, Construction and Use, pp. 130–135.

Primary Examiner—Marvin L. Nussbaum
Attorney, Agent, or Firm—Hill, Van Santen, Steadman & Simpson

[57] ABSTRACT

A surface wave filter with an input transducer and an output transducer. The input and output transducers have finger weightings such that a finger-overlap profile of the input/output transducer repeats in multiple fashion in the output/input transducer.

13 Claims, 4 Drawing Figures

ELECTRICAL FILTER WITH ACOUSTIC WAVES

BACKGROUND OF THE INVENTION

The present invention relates to an electrical filter wherein acoustic waves run close to a surface in a substrate thereof, and wherein at least one input transducer and at least one output transducer are provided in association with the substrate. An arrangement comprising two identically weighted transducers is specified in FIG. 7 in IEEE Transactions on Sonics and Ultrasonics, Mar. 1975, pages 105 through 114, incorporated herein.

Electrical filters with acoustic waves running in a substrate close to the surface and having an input transducer and an output transducer are known. What is meant by "running close to the surface" are not only surface waves (Raleigh and Bleustein waves) in the narrower sense, but also Love waves, SSBW, SBAW waves, and the like. For such acoustic waves, it is standard to employ fingers or electrode structures which are arranged on the surface of the substrate, and executed in accordance with the intended use. Such finger structures, namely interdigital transducer structures, reflector (strip) structures and further structures such as multi-strip coupler and the like, correspond in arrangement, dimensioning, and design to the rules prescribed by the given transfer function, resonator function, and the like.

The employment of finger overlap weighting is known for the use of a prescribed transfer function, this finger overlap weighting being provided such that the fingers of the comb structures of an interdigital transducer structure which engage into one another have a mutual overlap length of a greater or lesser size. It is standard to fill out non-overlapping finger lengths by dummy finger lengths in order to achieve uniformity of the surface occupation of the substrate surface with electrode fingers (see "Siemens Forschungs-Und Entwicklungs-Berichte, Volume 6 (1977), pages 132 through 136 (FIG. 5), incorporated herein.

In the following, electric filters with acoustic waves shall be referred to in summary as surface wave filters, even though this term is also understood in a narrower sense.

Surface wave filters, namely both transversal filters as well as resonator filters or resonators, are usually provided with such transducers as an input transducer and an output transducer. The first transducer has a finger overlap weighting and the second transducer is an unweighted transducer, i.e. its finger overlaps are maximum and identical for all fingers. Such a design, however, has the disadvantage of high weighting losses and higher insertion attenuation. This is particularly disturbing especially in resonator filters. Transversal modes which occur are also disturbing therein.

In an entirely different context than of the invention, Matthews, Surface Wave Filters, Design, Construction and Use, Verlag Wiley 1977, FIG. 3.13 on page 134, incorporated herein, discloses a filter with a finger-overlap-weighted input transducer and a finger-overlap-weighted output transducer. However, this filter necessarily forms a multi-strip coupler and thus does not comprise an in-line structure. The overlap weighting of both transducers, moreover, is at least practically identical.

A filter which likewise comprises a finger-overlap-weighted input transducer and a finger-overlap-weighted output transducer is also known from the above book, pages 131/132, incorporated herein. The overlap weightings of these two transducers are again at least essentially identical. In this filter, the dimensioning of the finger-overlap weightings of the input transducer and the output transducer is extremely difficult, since it is only accessible to an indirect mathematical acquisition, and one is relatively largely dependent on trial and error in this dimensioning. This disadvantage is cited in the above cited publication, in addition to further disadvantages.

SUMMARY OF THE INVENTION

An object of the present invention is to specify a filter of the above type which, given low weighting losses and low insertion attenuation, and a high degree of suppression of transversal modes in use as a resonator, can be designed in a way which is relatively easy to produce.

This object is achieved with an electrical filter wherein either the input or output transducer is a first type transducer and the output or input transducer is a second type transducer.

The first type transducer has a finger weighting and associated overlap profile defined by a prescribed transfer function based on an assumption that the second type transducer is first imagined to be a theoretical transducer having no finger weighting and a given length, the overlap profile being shaped by an envelope of finger overlaps. The second type transducer has a finger weighting and associated overlap profile which is an at least three-fold repetition of the overlap profile of the first transducer type. A length of the second type transducer is at least approximately the same as said given length of said given theoretical unweighted transducer upon which the first type transducer is based.

The filter of the invention has an in-line arrangement of the transducers. In general, a filter of the invention has one input transducer and one output transducer. However, for example, two input transducers and/or two output transducers can also be provided. For example, two input transducers or two output transducers can be arranged symmetrically relative to an output transducer or input transducer, respectively. Due to this multiple presence of input transducers or output transducers, these are referred to as "transducer types", whereby a first transducer type comprises all of the input transducers and a second transducer type comprises all of the output transducers. The first transducer or the first transducer type "input transducer or output transducer", has a finger-overlap weighting conditioned by the prescribed transfer function or, as may be mathematically derived given application of the standard design technique based on one (or more) unweighted transducers of the second transducer type. In other words, the transducer or the transducers of the first transducer type are treated within the scope of the invention such that when producing the design, a filter of the prior art type may be designed.

In the invention, the design result produced for the first transducer type is also taken into consideration for the one or more transducers of the second transducer type, such transducer or transducers of the second type being provided with a finger-overlap weighting in accordance with the invention which has a relation to the first type. This finger-overlap weighting of the second transducer type, however, is in no way identical to that of the first transducer type. A periodicity necessarily having at least a three-fold repetition of the finger overlap profile of the first transducer type is provided for the other transducer type, i.e. a periodic repetition of the design is to be provided. The length of this transducer or transducers of the second transducer type is approximately identical to a length of a theoretical transducer which, as an unweighted transducer, has formed the basis for the design of the transducers of the first transducer type. In particular, this length dimension lies between 0.8 and 1.2 times the length of the basic unweighted transducer. A rational upper limit for the plurality of repetitions of the finger-overlap path of the transducer of the first transducer type in the one or more transducers of the second transducer type lies roughly at the number 20. About 5 to 10 repetitions are particularly favorable.

DESCRIPTION OF THE PREFERRED EMBODIMENTS

Figure 1:
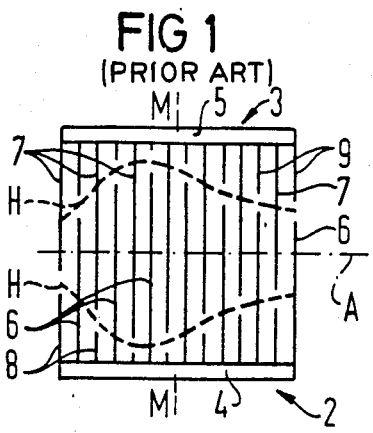
FIG. 1 shows, as an example, a single finger-overlap-weighted interdigital transducer of the prior art.

FIG. 1 shows a single interdigital transducer formed of two interengaging comb structures 2 and 3. The bus bars are referenced 4 and 5. The fingers 6 of the comb structure 2 are connected to the bus bar 4. The analogous case applies to the fingers 7 of the comb structure 3 and the bus bar 5. As may be seen, a respective overlap lies between a finger 6 of the one comb structure and the neighboring finger 7 of the other comb structure 3. These overlap lengths are emphasized by the broken-line envelopes H in accordance with the illustration. The area of the interdigital transducer 3 situated between the two envelopes H forms the overlap profile of this interdigital transducer. Depending on the transfer function required, defined overlap profiles are present. In particular, the overlap profile comprising the envelopes H (as in the interdigital transducer of FIG. 1) can be symmetrical relative to the axis A (principal wave propagation direction of this transducer). The example of FIG. 1 shows a transducer having a non-mirror-symmetrical profile in the direction of the axis A with reference to the central plane M of the transducer which is perpendicular to the axis A, i.e., the transducer of FIG. 1 does not have a symmetrical distribution of the overlap weightings in this regard. The axis of the finger overlap profile (coinciding with the axis A in FIG. 1) can also proceed through the transducer in an oblique direction, or can also proceed therethrough in a changing direction. Such examples are well known.

The transducer of FIG. 1 additionally comprises dummy fingers 8 or 9 which are likewise connected to the bus bars 4 or 5. Since these dummy fingers 8 or 9 do not have any overlap with finger lengths of fingers 7 or 6 of the other respective comb structure, these dummy fingers 8, 9 are electrically inactive. They are nonetheless inserted into such a transducer structure in order to achieve the greatest possible uniformity for the mechanical propagation conditions of the wave to be generated by the transducer, or of the wave to be received by the transducer.

Figure 2:
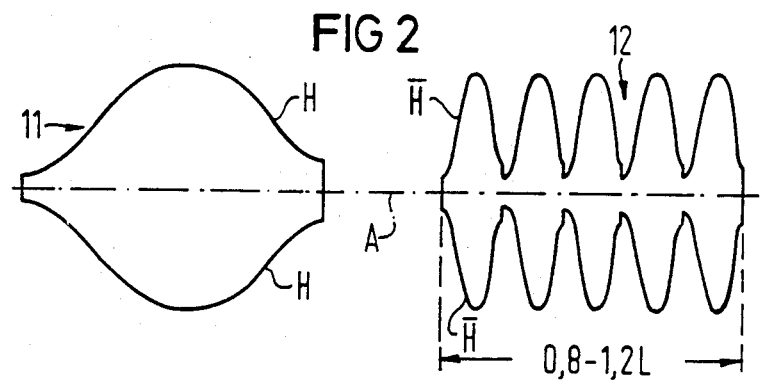
FIGS. 2 and 3 show the weighting profile of a first and of a second exemplary embodiment of a filter of the invention.

FIG. 2 shows a first exemplary embodiment of the invention. For the sake of clarity, only the overlap profile with its envelopes H is shown of a first transducer 11 (of a first transducer type). This overlap profile essentially corresponds to that of the interdigital transducer of FIG. 1. Reference numeral 12 indicates the overlap profile of the (corresponding) second transducer 12 (of the second transducer type). This overlap profile is provided in accordance with the invention. The envelopes of this profile are referenced $\overline{H}$. The profile of this second transducer 12 has five repetitions of the overlap profile of the envelopes H of the first transducer 11. The length of this second transducer 12 is preferably dimensioned from 0.8 to 1.2 times the length of the transducer which forms the basis for the design of the finger-overlap weighting of the transducer 11.

As may also be seen from FIG. 2, the asymmetry of the profile present in the direction of the axis A (already explained with reference to FIG. 1) and comprising the envelopes H, continues in the transducer 12 of the second transducer type, but extending along the axial direction A. The illustrated non-uniformities therefore exist at the irregularities or joints of the repetitions.

As is usual, the transducers 11 and 12 are situated on a substrate member to be employed for such electrical filters. All further details of such a filter of FIG. 2 are of a known nature.

The transducer 11 can be the input transducer and the transducer 12 can be the output transducer of the filter corresponding thereto. However, the transducer 12 can also be the input transducer and the transducer 11 can be the output transducer.

Figure 3:
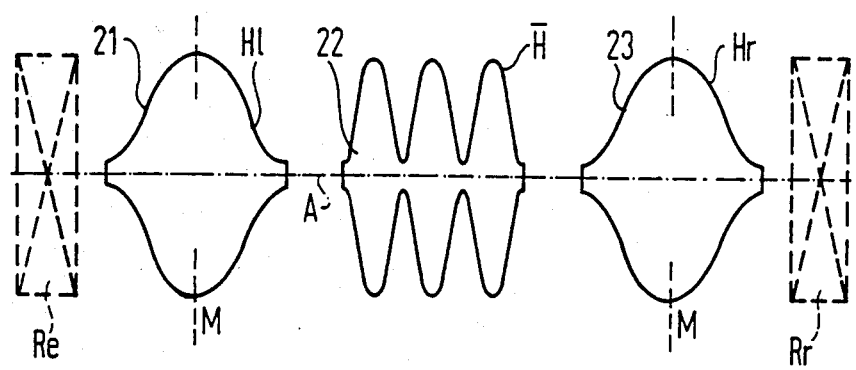

FIG. 3 shows a second exemplary embodiment of the invention. This is an example of a filter comprising two transducers 21 and 23 of a first transducer type having the mutually coinciding overlap profiles comprising the (likewise coinciding) envelopes Hl and Hr. These transducers 21 and 23 are aligned on the axis A of the filter, and are situated at the one side and at the other side of the transducer 22 of a second transducer type. The envelopes $\overline{H}$ indicate the overlap profile thereof. Given such an arrangement of transducers 21 and 23 of the first transducer type which is symmetrical with reference to the illustrated transducer 22 of the second transducer type, a profile of the finger-overlap weighting which is symmetrical relative to the center plane M (already defined in FIG. 1) of the transducer 21 or 23 is to be provided. This can be achieved by an appropriate fashioning of the filter design for prescribed transfer functions. No problems whatsoever for the transducer 22 (of the other transducer type) derives with this symmetrical distribution relative to the indicated center plane M. In other words, the repetitions of the profile of the one transducer 21 or 23 is a dislocation in the direction of the axis A in accordance with the invention (toward the right for the transducer 21 and toward the left for the transducer 23). The transducer 22 comprises three repetitions of the profile of the transducer 21 or 23. The non-uniformity is also eliminated here due to the symmetry. In the filter of FIG. 3, the transducers 21 and 23 can be the input and the transducer 22 can be the output, or the transducer 22 can be the input and the transducers 21 and 23 can be outputs. The profiles of the transducers 21 and 23 coincide.

FIG. 3 also shows two resonator structures Rl and Rr shown in broken lines. Such reflector structures R are employed in resonator filters or resonators, so that FIG. 3 also shows the alternative of such a filter.

Figure 4:
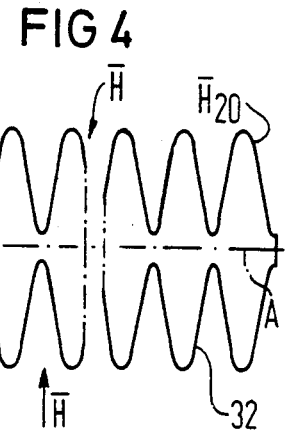
FIG. 4, in a fragmented illustration, shows separately a transducer of the second transducer type having twenty repetitions.

Interrupted in the direction of the axis A, FIG. 4 shows a transducer 32 of a second transducer type having a profile comprising the envelopes $\overline{H}$. The presence of, for example, twenty repetitions, is indicated with $\overline{H}_1$ through $\overline{H}_{20}$. In accordance with the invention, these $\overline{H}_1$ through $\overline{H}_{20}$ are repetitions of the profile H of the corresponding transducer (not shown) of a first transducer type.

Given a length L of the unweighted transducer on which the design for the corresponding transducers 11 or 21, 23 (of a first transducer type) is respectively based, the transducers 12 or 22 (of a second transducer type) preferably have a length (in the direction of the axis A) of between 0.8 to 1.2L. The analogous case applies to the length of the transducer 32.

Although various minor changes and modifications might be proposed by those skilled in the art, it will be understood that I wish to include within the claims of the patent warranted hereon all such changes and modifications as reasonably come within my contribution to the art.

I claim as my invention:

1. An electrical filter wherein acoustic waves run close to a surface in a substrate thereof, comprising:
   at least one input transducer of a first transducer type and at least one output transducer of a second transducer type associated with a substrate;
   the input and output transducers having respective finger-overlap weightings and being arranged in-line in a wave propagation direction;
   the first type transducer having a finger weighting and associated overlap profile defined by a prescribed transfer function based on an initial assumption that the second type transducer is first considered to be a theoretical transducer having no finger weighting and a given length, said overlap profile being shaped by an envelope of finger overlaps;
   the second type transducer having a finger weighting and associated overlap profile which is an at least 3-fold repetition of the overlap profile of the first transducer type; and
   a length of the second type transducer being at least approximately the same as said given length of said given theoretical unweighted transducer upon which the first type transducer is based.

2. An electrical filter according to claim 1 wherein said first type transducer has an overlap profile which is symmetrical with reference to a center plane of the transducer which is perpendicular to the wave propagation direction.

3. An electrical filter according to claim 1 wherein the first type transducer has an overlap profile which is asymmetrical with reference to a center plane of the transducer which is perpendicular to the wave propagation direction.

4. An electrical filter according to claim 1 wherein the second type transducer has between 3 and 20 repetitions of the overlap profile of the first transducer type.

5. An electrical filter according to claim 4 wherein between 5 and 10 repetitions are provided in the second type transducer.

6. An electrical filter according to claim 1 wherein two first transducer type transducers are provided and one second type transducer is provided, the second type transducer being situated between the two first type transducers.

7. An electrical filter according to claim 1 wherein two second type transducers are provided and one first type transducer is provided, the first type transducer being arranged between the two second type transducers.

8. An electrical filter according to claim 1 wherein at least one resonator structure is provided in operational association with one of the transducers.

9. An electrical filter according to claim 1 wherein said length of the second type transducer is in a range from 0.8 to 1.2 times the length of said theoretical unweighted transducer upon which the first type transducer design is based.

10. An electrical filter wherein acoustic waves run in a substrate, comprising:
    a substrate in at least one input transducer and at least one output transducer associated with the substrate;
    the input transducer being one of a first or second type and the output transducer being one of a second or first type, respectively;
    the first type transducer having a finger weighting and associated overlap profile defined by a prescribed transfer function based on an assumption that the second type transducer is first imagined to be a theoretical transducer having no finger weighting and a given length, said overlap profile being shaped by an envelope of finger overlaps;
    the second type transducer having a finger weighting and associated overlap profile which is an at least three-fold repetition of the overlap profile of the first transducer type; and
    a length of the second type transducer being in a range from 0.8 to 1.2 times said given length of said given theoretical unweighted transducer upon which the first type transducer is based.

11. A resonator filter wherein acoustic waves run close to a surface in a substrate thereof, comprising:
    a first resonator structure, a central transducer, first and second transducers on either side of the central transducer, and a second resonator structure arranged such that the central and first and second transducers lie between the first and second resonator structures;
    the first and second transducers or the central transducer being of a first transducer type and the central or first and second transducers being of a second transducer type;
    the input transducer being of a first or second type and the output transducer being of a second or first type, respectively;
    the first type transducer having a finger weighting and associated overlap profile defined by a prescribed transfer function based on an initial assumption that the second type transducer is first considered to be a theoretical transducer having no finger weighting and a given length, said overlap profile being shaped by an envelope of finger overlaps;
    the second type transducer having a finger weighting and associated overlap profile which is an at least three-fold repetition of the overlap profile of the first transducer type; and
    a length of the second type transducer being in a range from 0.8 to 1.2 times said given length of said given theoretical unweighted transducer upon which the first type transducer is based.

12. An electrical filter wherein acoustic waves run close to a surface in a substrate thereof, comprising:

a first transducer and an associated second transducer on a common substrate;

the first and second transducers having respective finger-overlap weightings and being arranged in-line in a wave propagation direction;

the first transducer having a finger weighting and associated overlap profile defined by a prescribed transfer function based on an initial assumption that the second transducer is first considered to be a theoretical transducer having no finger weighting and a given length, said overlap profile being shaped by an envelope of finger overlaps;

the second transducer having a finger weighting and associated overlap profile which is an at least three-fold repetition of the overlap profile of the first transducer; and a length of the second transducer being at least approximately the same as said given length of said given theoretical unweighted transducer upon which the first transducer is based.

13. A method for constructing an electrical filter wherein acoustic waves run close to a surface in a substrate thereof, comprising the steps of:

providing a first transducer and at least one associated second transducer on the substrate;

designing the first transducer such that it has a finger weighting and associated overlap profile defined by a prescribed transfer function based on an initial assumption that the second transducer is first considered to be a theoretical transducer having no finger weighting and a given length, said overlap profile being shaped by an envelope of finger overlaps;

providing the second transducer with a finger weighting and associated overlap profile which is an at least three-fold repetition of the overlap profile of the first transducer; and providing a length of the second transducer at least approximately the same as said given length of said given theoretical unweighted transducer upon which the first transducer is based.

* * * * *